United States Patent
Huang et al.

(10) Patent No.: US 12,080,618 B2
(45) Date of Patent: Sep. 3, 2024

(54) ELECTRONIC PACKAGE, HEAT DISSIPATION STRUCTURE AND MANUFACTURING METHOD THEREOF

(71) Applicant: SILICONWARE PRECISION INDUSTRIES CO., LTD., Taichung (TW)

(72) Inventors: Yu-Lung Huang, Taichung (TW); Kuo-Hua Yu, Taichung (TW); Chang-Fu Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 171 days.

(21) Appl. No.: 17/583,946

(22) Filed: Jan. 25, 2022

(65) Prior Publication Data

US 2022/0375813 A1    Nov. 24, 2022

(30) Foreign Application Priority Data

May 24, 2021  (TW) ................................ 110118681

(51) Int. Cl.
*H01L 23/48*   (2006.01)
*H01L 23/367*  (2006.01)
*H01L 23/00*   (2006.01)

(52) U.S. Cl.
CPC .......... *H01L 23/3675* (2013.01); *H01L 24/29* (2013.01); *H01L 24/32* (2013.01); *H01L 2224/29109* (2013.01); *H01L 2224/2919* (2013.01); *H01L 2224/29191* (2013.01); *H01L 2224/2929* (2013.01); *H01L 2224/29291* (2013.01); *H01L 2224/293* (2013.01); *H01L 2224/29393* (2013.01); *H01L 2224/32221* (2013.01); *H01L 2924/0635* (2013.01)

(58) Field of Classification Search
CPC ... H01L 2924/0635; H01L 2224/32221; H01L 2224/2929; H01L 2224/2919; H01L 2224/29109; H01L 2224/29291; H01L 2224/29191; H01L 23/3675
See application file for complete search history.

(56) References Cited

U.S. PATENT DOCUMENTS

| | | | |
|---|---|---|---|
| 6,281,573 B1 * | 8/2001 | Atwood | H01L 23/3675 257/710 |
| 9,887,167 B1 * | 2/2018 | Lee | H01L 21/4882 |
| 2021/0020537 A1 * | 1/2021 | Chan Arguedas | H01L 24/29 |

* cited by examiner

*Primary Examiner* — Hoa B Trinh
(74) *Attorney, Agent, or Firm* — Studebaker & Brackett PC

(57) ABSTRACT

A heat dissipation structure is provided and includes a heat dissipation body and an adjustment channel. A carrying area and an active area adjacent to the carrying area are defined on a surface of the heat dissipation body, the carrying area is used for applying a first heat dissipation material thereonto, and the adjustment channel is formed in the active area, where one end of the adjustment channel communicates with the outside of the heat dissipation structure, and the other end communicates with the carrying area. Therefore, when the heat dissipation body is coupled to the electronic component by the first heat dissipation material, the adjustment channel can adjust a volume of the first heat dissipation material.

27 Claims, 15 Drawing Sheets

ELECTRONIC PACKAGE, HEAT DISSIPATION STRUCTURE AND MANUFACTURING METHOD THEREOF

BACKGROUND

1. Technical Field

The present disclosure relates to a package structure, and more particularly, to an electronic package with a heat dissipation structure and its heat dissipation structure and manufacturing method.

2. Description of Related Art

With the vigorous development of portable electronic products in recent years, various related products have gradually developed toward high-density, high-performance, and light, thin, short, and small trends. Various types of semiconductor package structures that are applied to the portable electronic products are thus rolled out, in order to meet the requirements of lightness, thinness, small size and high-density.

With the increase in the demand for functions and processing speed of electronic products, semiconductor chips as core components of electronic products need to have higher density of electronic components and electronic circuits, so a larger amount of heat energy will be generated when the semiconductor chips are in operation. Furthermore, since the traditional encapsulant for covering the semiconductor chip is a poor heat transfer material with a thermal conductivity of only 0.8 (unit $W \cdot m^{-1} \cdot k^{-1}$) (that is, the heat dissipation efficiency is not good), if the heat energy generated by the semiconductor chip cannot be effectively dissipated, it will cause damage to the semiconductor chip and product reliability problems.

Therefore, in order to quickly dissipate heat to the outside, the industry usually configures a heat dissipation sheet (a heat sink or a heat spreader) in a semiconductor package. The heat dissipation sheet is usually bonded to the back of the semiconductor chip by means of a heat-dissipating glue, such as a thermal interface material (abbreviated as TIM), such that the heat generated by the semiconductor chip can be dissipated by the heat-dissipating glue and the heat sink. Furthermore, usually the top surface of the heat dissipation sheet is exposed to the encapsulant or directly exposed to the atmosphere, so as to obtain a better heat dissipation effect.

As shown in FIG. 1, the conventional method for manufacturing a semiconductor package 1 is to first place a semiconductor chip 11 with its active surface 11a on a package substrate 10 using flip chip bonding (that is, through conductive bumps 110 and an underfill 111), a heat dissipation element 13 with its top sheet 130 is bonded to an inactive surface 11b of the semiconductor chip 11 through the TIM layer 12, and supporting legs 131 of the heat dissipation element 13 are erected on the package substrate 10 through an adhesive layer 14.

During operation, the heat generated by the semiconductor chip 11 is conducted to the top sheet 130 of the heat dissipation element 13 via the inactive surface 11b and the TIM layer 12 to dissipate heat to the outside of the semiconductor package 1.

Furthermore, in order to cope with the development trend of electronic products toward multi-contact (I/O), large-size package specifications, large area, and high heat dissipation, a liquid metal is used to make the TIM layer 12 to replace the traditional hard material TIM.

However, in the conventional semiconductor package 1, because the TIM layer 12 is a liquid metal, it is a fluid and expands at high temperatures, making it impossible to stably lay on the inactive surface 11b of the semiconductor chip 11. It may even overflow outside the semiconductor package 1, causing other components outside the semiconductor package 1 to be contaminated.

Therefore, how to overcome the above-mentioned problems of the prior art has become an urgent problem to be solved at present.

SUMMARY

In view of the various deficiencies of the prior art, the present disclosure provides a heat dissipation structure comprising: a heat dissipation body having a first side and a second side opposite to each other, and a carrying area and an active area adjacent to the carrying area are defined on a surface of the first side, wherein the carrying area is used for applying a first heat dissipation material thereonto; and an adjustment channel formed in the active area, wherein one end of the adjustment channel communicates with outside of the heat dissipation structure, and the other end of the adjustment channel communicates with the carrying area to adjust a volume of the first heat dissipation material.

In the aforementioned heat dissipation structure, the adjustment channel has a fluid section and a gas section that are connected to each other, the fluid section communicates with the carrying area to adjust the volume of the first heat dissipation material, and one end of the gas section opposite to the fluid section communicates with the outside of the heat dissipation structure. For example, a cross-sectional area of the fluid section is tapered from the carrying area toward the gas section. Further, the fluid section is tapered with an included angle formed by its opposite sides, and the included angle is at most 70 degrees.

Alternatively, the smallest width of the cross-sectional area of the fluid section is smaller than a height of a cross-sectional area of the gas section. Or, one of ends of the gas section communicates with the fluid section, and the other end of the gas section is away from the fluid section, such that the cross-sectional area of the gas section is tapered from the fluid section toward the other end. Further, the gas section is tapered with an included angle formed by its opposite sides, and the included angle is at most 70 degrees.

In addition, the adjustment channel has a plurality of gas sections, and each of the gas sections communicates with the fluid section.

In the aforementioned heat dissipation structure, a height of a cross-sectional area of the gas section is 10 microns to 1200 microns.

In the aforementioned heat dissipation structure, the adjustment channel is formed by stacking a first heat dissipation element and a second heat dissipation element.

In the aforementioned heat dissipation structure, a space is defined in the carrying area, one of two opposite sides of the space is the surface of the first side, and the other is a horizontal plane separated from the surface of the first side by a gap, and the space is a rectangle, wherein the carrying area has a corner section extending from a center point toward a corner of the rectangle, and a line section extending from the center point toward an edge of the rectangle, and wherein a volume of the space corresponding to the corner section is smaller than a volume of the space corresponding to the line section.

The present disclosure also provides an electronic package comprising: a carrying structure; an electronic component provided on the carrying structure; and the aforementioned heat dissipation structure bonded to the electronic component through the first heat dissipation material on the heat dissipation body.

In the aforementioned electronic package, the adjustment channel has a fluid section and a gas section that are connected to each other, wherein the fluid section communicates with the carrying area to adjust the volume of the first heat dissipation material, and the gas section communicates with the outside of the heat dissipation structure to discharge gas.

In the aforementioned electronic package, the adjustment channel adjusts the volume of the first heat dissipation material along a direction away from the electronic component.

In the aforementioned electronic package, a ring body is formed within the active area in a manner that the ring body surrounds a side surface of the electronic component, such that the adjustment channel is located between the ring body and the side surface of the electronic component for adjusting the volume of the first heat dissipation material along the side surface of the electronic component. For example, the adjustment channel is further located between a bottom side of the ring body and the carrying structure.

In the aforementioned electronic package, a ring body is formed on the electronic component by a second heat dissipation material and is positioned within the active area, such that the second heat dissipation material laterally blocks the first heat dissipation material. For example, the ring body, the second heat dissipation material, and the electronic component cooperate with each other to form a buffer channel, and one port of the buffer channel communicates with the adjustment channel, and the second heat dissipation material seals the other port of the buffer channel. Further, a width of the port of the buffer channel communicates with the adjustment channel is smaller than a width of the port of the adjustment channel communicates with the carrying area. Alternatively, a width of a cross-sectional area of the buffer channel is 20 microns to 300 microns. Or, a cross-sectional area of the buffer channel is tapered from the carrying area toward the second heat dissipation material.

In the aforementioned electronic package, the heat dissipation structure further has a ring body surrounding a side surface of the electronic component and bonded to the carrying structure by a second heat dissipation material, such that the ring body, the second heat dissipation material and the side surface of the electronic component cooperate to form a buffer channel, wherein one port of the buffer channel communicates with the adjustment channel, and the second heat dissipation material seals the other port of the buffer channel. For example, a cross-sectional area of the buffer channel is tapered along the side surface of the electronic component toward the carrying structure. Further, an inner side surface of the ring body corresponding to the electronic component is formed with a wedge whose thickness gradually increases toward the carrying structure.

In the aforementioned electronic package, the first heat dissipation material includes metal.

The present disclosure further provides a manufacturing method of a heat dissipation structure, comprising: providing a first heat dissipation element and a second heat dissipation element; stacking the first heat dissipation element and the second heat dissipation element with each other to form the aforementioned heat dissipation structure.

In the aforementioned manufacturing method, the first heat dissipation element includes a ring body, and the second heat dissipation element includes the heat dissipation body, wherein after the first heat dissipation element and the second heat dissipation element are stacked, the ring body and the heat dissipation body are cooperated to form the adjustment channel positioned in the active area.

It can be seen from the above that the electronic package and the heat dissipation structure and manufacturing method of the present disclosure are mainly provided by the adjustment channel to adjust a space where the first heat dissipation material thermally expands, such that the first heat dissipation material can be stably applied on the electronic component at high temperatures. Accordingly, compared with the prior art, the heat dissipation structure of the present disclosure can effectively prevent the first heat dissipation material from overflowing out of the electronic package, and thus can avoid the problem of contamination of other components outside the electronic package.

BRIEF DESCRIPTION OF THE DRAWINGS

FIG. 3G-1 is a schematic cross-sectional view of another aspect of FIG. 3A.

FIG. 3G-2 is a schematic top view of FIG. 3G-1 along a A1-A1 cross-section.

FIG. 3G-3 is a schematic top view of FIG. 3G-1 along a B1-B1 cross-section.

FIG. 3H-1 is a schematic cross-sectional view of another aspect of FIG. 3G-1.

FIG. 3H-2 is a schematic top view of FIG. 3H-1 along a A2-A2 cross-section.

FIG. 3H-3 is a schematic top view of FIG. 3H-1 along a B2-B2 cross section.

FIG. 4A-1, FIG. 4A-2 and FIG. 4A-3 are partial cross-sectional schematic views of different aspects of FIG. 2.

FIG. 4B-1 is a schematic top view of FIG. 2 along a A3-A3 cross section.

FIGS. 4B-2 to 4B-8 are schematic partial top views of different aspects of FIG. 4B-1.

FIG. 4C-1 is a schematic partial enlarged cross-sectional view of FIG. 2.

FIGS. 4C-2 to 4C-4 are schematic cross-sectional views of different aspects of FIG. 4C-1.

FIG. 4E-1 is a schematic partial enlarged top view of another aspect of FIG. 4B-1.

FIG. 4E-2 is a schematic partial cross-sectional view of FIG. 4E-1 omitting the first heat dissipation material.

DETAILED DESCRIPTIONS

The following describes the implementation of the present disclosure with specific examples. Those skilled in the art can easily understand the other advantages and effects of the present disclosure from the content disclosed in this specification.

It should be understood that, the structures, ratios, sizes, and the like in the accompanying figures are used to illustrate the content disclosed in the present specification for one skilled in the art to read and understand, rather than to limit the conditions for practicing the present disclosure. Any modification of the structure, alteration of the ratio relationship, or adjustment of the size without affecting the possible effects and achievable proposes should still fall in the range compressed by the technical content disclosed in the present specification. Meanwhile, terms such as "upper," "first," "second" and the like used herein are merely used for clear explanation rather than limiting practical range by the present disclosure, and thus, the alteration or adjustment of relative relationship thereof without essentially altering the technical content should be considered in the practical scope of the present disclosure.

Figure 2:
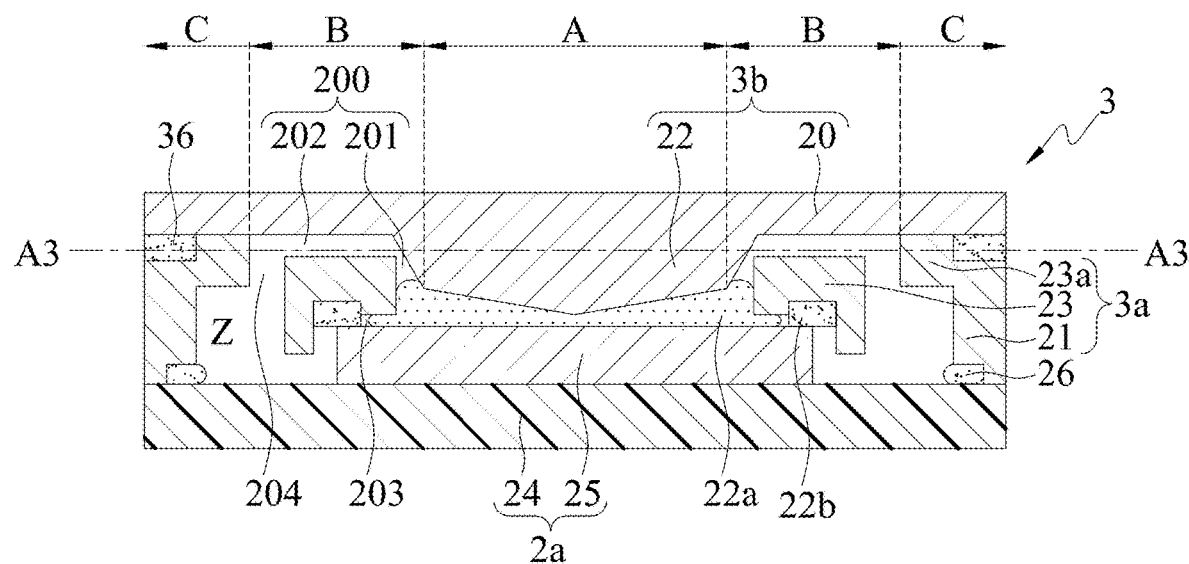
FIG. 2 is a schematic cross-sectional view of a first embodiment of a heat dissipation structure used in an electronic package according to the present disclosure.
Figure 3A:
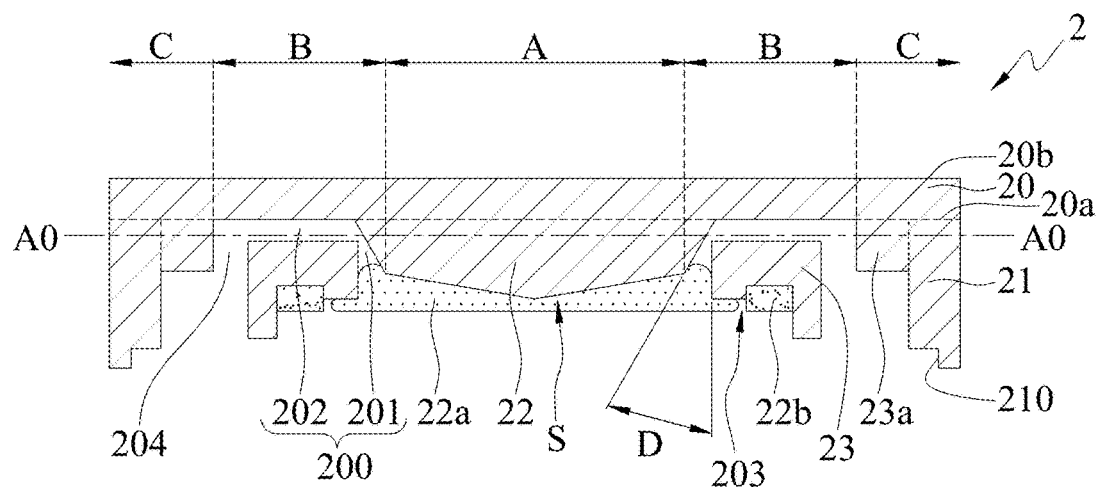
FIG. 3A is a schematic cross-sectional view of a second embodiment of the heat dissipation structure according to the present disclosure.

FIG. 2 is a schematic cross-sectional view of a first embodiment of a heat dissipation structure 3 of the present disclosure, and FIG. 3A is a schematic cross-sectional view of a second embodiment of a heat dissipation structure 2 of the present disclosure. The difference between the first embodiment and the second embodiment lies in the manufacturing method. Among them, the heat dissipation structure 3 of the first embodiment is composed of a plurality of heat dissipation elements (such as a first heat dissipation element 3a and a second heat dissipation element 3b). The heat dissipation structure 2 of the second embodiment is a single-plate integrally formed structure, so the structural features described below are commonly used in the first and second embodiments, and are hereby described.

Figure 3B:
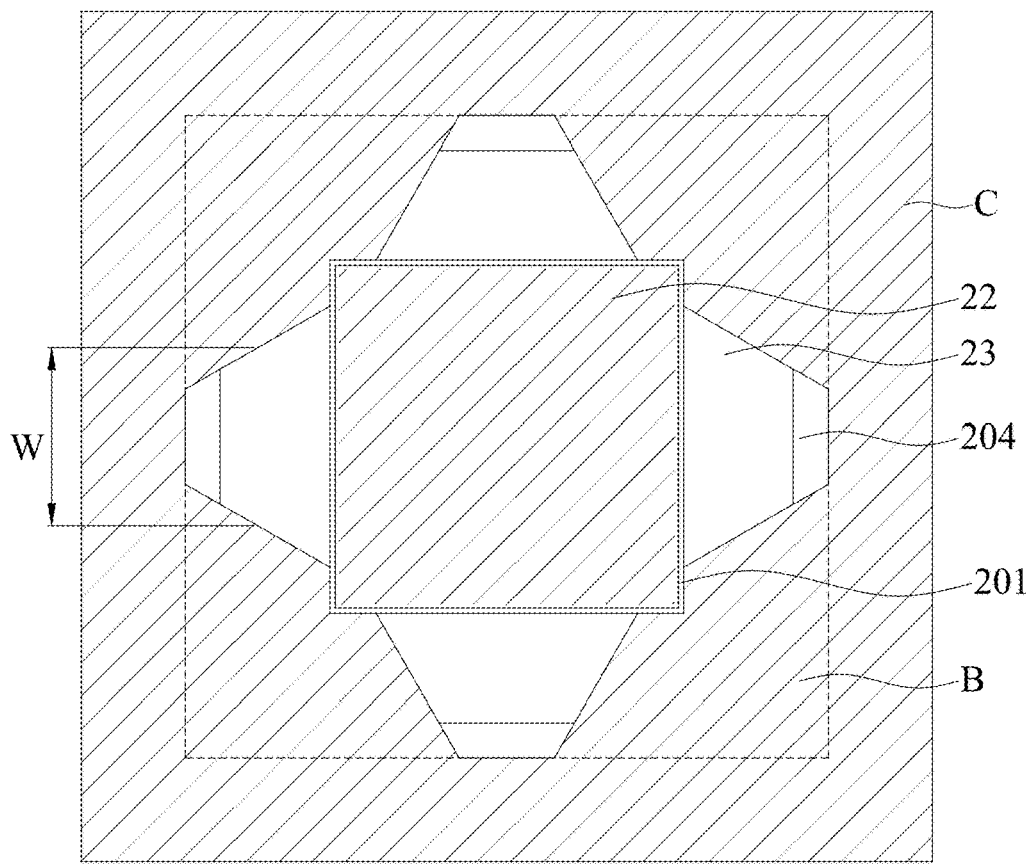
FIG. 3B is a schematic top view of FIG. 3A along a A0-A0 cross section.

As shown in FIGS. 2 and 3A, the heat dissipation structure 2, 3 includes a sheet-shaped heat dissipation body 20 and at least one supporting leg 21 standing on the heat dissipation body 20, wherein the heat dissipation body 20 has a first side 20a and a second side 20b opposite to the first side 20a, and a surface of the first side 20a is defined from the inside (center) to the outside in order to have a carrying area A, an active area B adjacent to the carrying area A, and a peripheral area C adjacent to the active area B, such that the supporting leg 21 is disposed in the peripheral area C of the first side 20a, as shown in FIG. 3B.

Figure 3C:
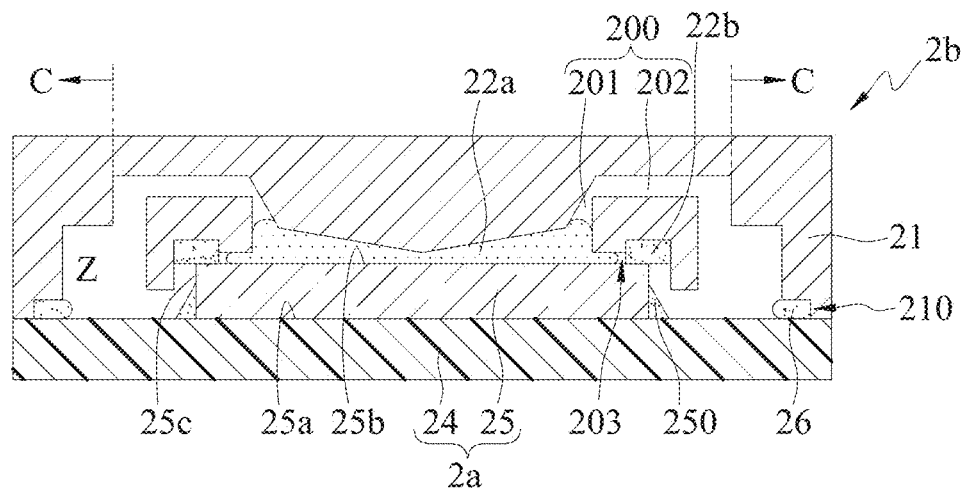
FIG. 3C is a schematic cross-sectional view of the heat dissipation structure of FIG. 3A used in an electronic package.

A heat dissipation block 22 protruding from the first side 20a is positioned in the carrying area A, and the heat dissipation block 22 has a concave-convex surface S to carry a first heat dissipation material 22a as a thermal interface material (abbreviated as TIM) for combining a heat-generating component 2a (to form an electronic package 2b as shown in FIG. 3C).

Figure 3D:
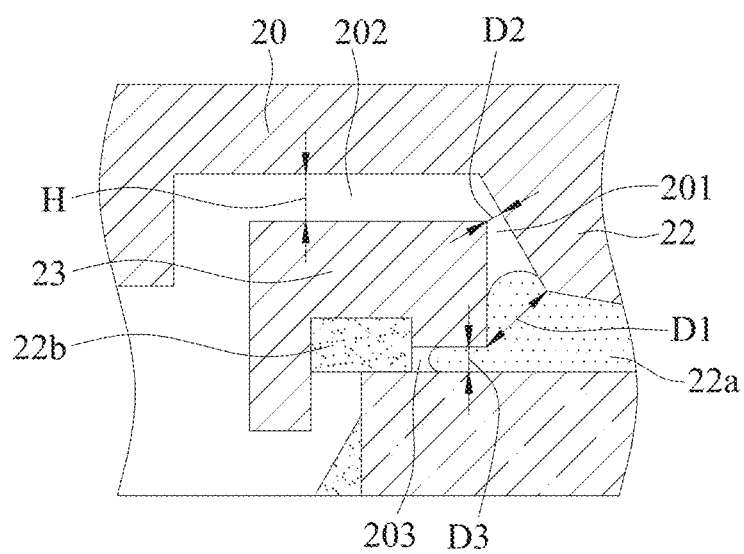
FIG. 3D is a schematic partial enlarged cross-sectional view of FIG. 3C.
Figure 3E:
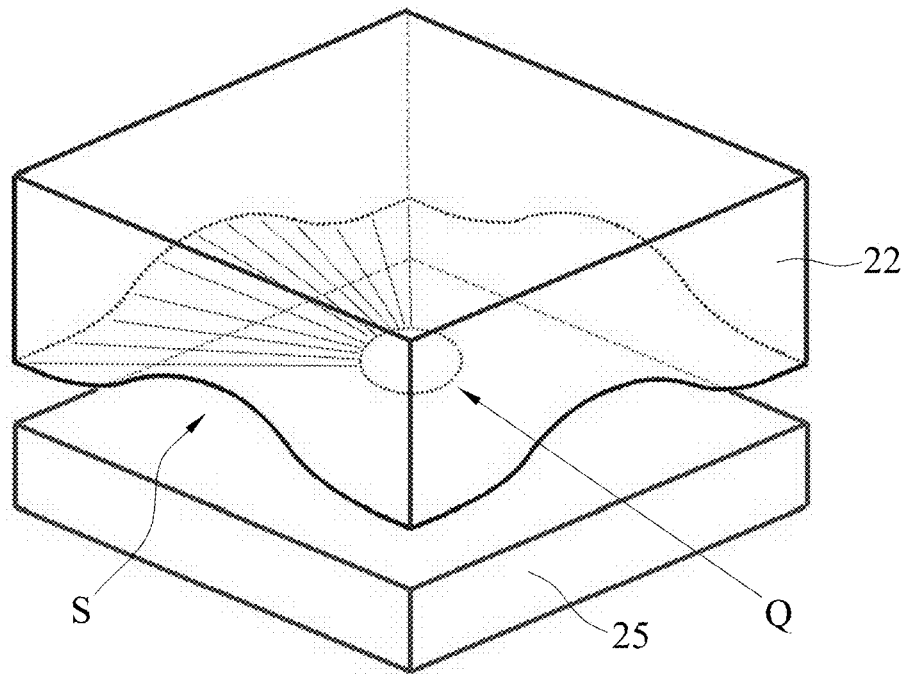
FIG. 3E and FIG. 3F are partial three-dimensional schematic views of FIG. 3C.
Figure 3F:
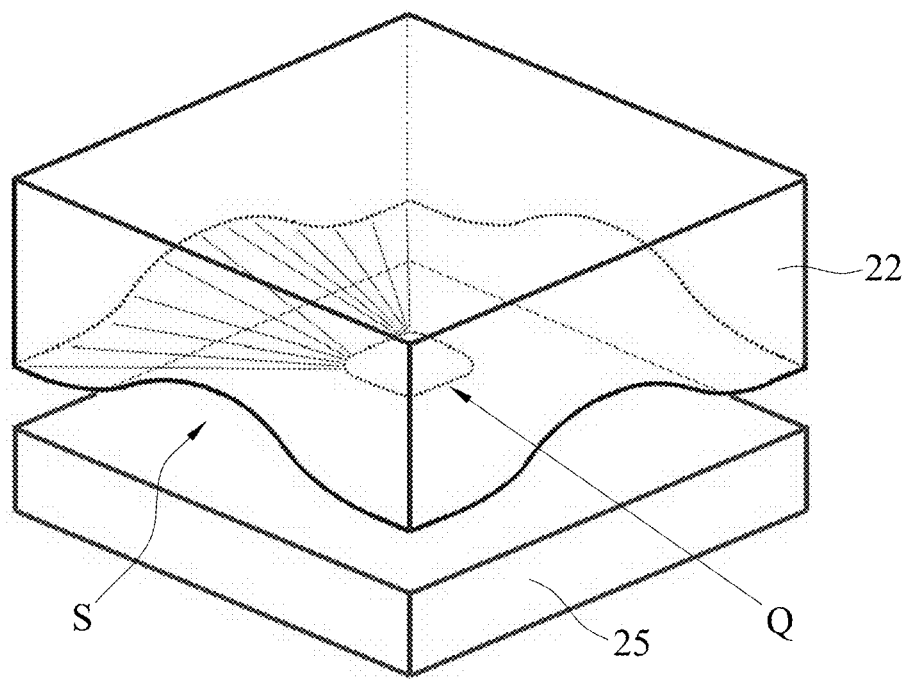

In the first and second embodiments, the heat dissipation block 22 is cone-shaped or hill-shaped, and the first heat dissipation material 22a is filled in the concave portion of the concave-convex surface S of the heat dissipation block 22. For example, the concave-convex surface S is collective one that is formed by a plurality of wavy curved surfaces, as shown in FIG. 3E or FIG. 3F, which are arranged around a central area Q (a circular outline as shown in FIG. 3E or a rectangular outline as shown in FIG. 3F) of the heat dissipation block 22 to form a lotus leaf folded edge.

Furthermore, the first heat dissipation material 22a has a high thermal conductivity, about 25 to 80 $Wm^{-1}K^{-1}$. For example, the first heat dissipation material 22a is made of solid indium (In), liquid metal, or any other metal-containing material that is fluid at room temperature/high temperature, and is pressed onto the heating object 2a by the heat dissipation block 22.

In addition, the heating object 2a is a package module, which includes a carrying structure 24 and an electronic component 25 disposed on the carrying structure 24, and the first heat dissipation material 22a is combined on the electronic component 25. For example, the carrying structure 24 is, for example, a package substrate with a core layer and a wiring structure, a package substrate with a coreless wiring structure, and a through silicon interposer (abbreviated as TSI) with a through-silicon via (abbreviated as TSV) or other board type, which includes at least one insulating layer and at least one wiring layer combining the insulating layer, such as at least one fan out type redistribution layer (abbreviated as RDL). It should be understood that the carrying structure 24 can also be other chip-carrying plates, such as a lead frame, a wafer, or other boards with metal routing, and is not limited to the above.

In addition, the electronic component 25 is an active component, a passive component, a chip module, or a combination thereof, wherein the active component is a semiconductor chip, and the passive component is a resistor, a capacitor, and an inductor. In the first and second embodiments, the electronic component 25 is a semiconductor chip, which has an active surface 25a and an inactive surface 25b opposite to each other. The active surface 25a is provided on the wiring layer of the carrying structure 24 in a flip chip manner by a plurality of conductive bumps such as solder materials, metal pillars or others, and is electrically connected to the wiring layer. The electronic component 25 is encapsulated by an underfill 250, and the first heat dissipation material 22a is bonded to the inactive surface 25b. Alternatively, the electronic component 25 can be electrically connected to the wiring layer of the carrying structure 24 by means of a plurality of bonding wires (not shown). Or, the electronic component 25 can directly contact the wiring layer of the carrying structure 24. It should be understood that there are many ways in which the electronic component 25 is electrically connected to the carrying structure 24, and the carrying structure 24 can be connected to the required types and numbers of electronic components, which are not limited to the above.

The active area B is formed with an adjustment channel 200 connected from the carrying area A to the peripheral area C to adjust the volume of the first heat dissipation material 22a. A ring body 23 (as shown in FIG. 3D) is formed to bond on the heat-generating component 2a (or the electronic component 25) via a second heat dissipation material 22b and is positioned in the active area B. The adjustment channel 200 is divided into a fluid section 201 formed by the ring body 23 and the heat dissipation block 22 and at least one gas section 202 formed by the ring body 23 and the heat dissipation body 20.

Figure 1:
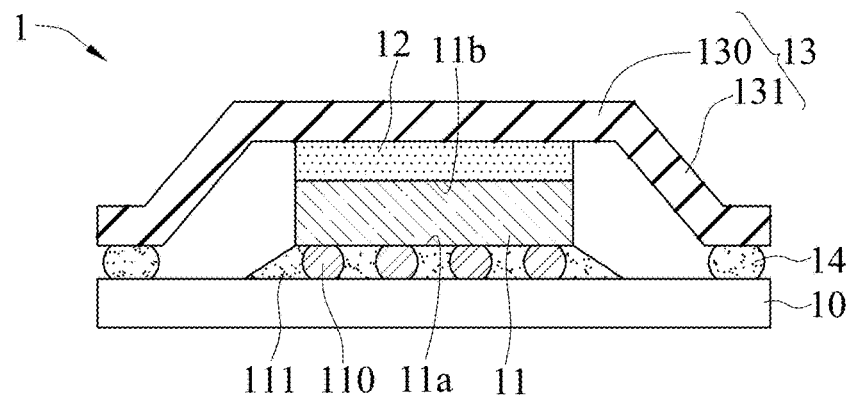
FIG. 1 is a schematic cross-sectional view of a conventional semiconductor package.

In the first and second embodiments, the fluid section 201 can accommodate the first heat dissipation material 22a to adjust the volume of the first heat dissipation material 22a, and one end of the gas section 202 is connected to the fluid section 201, and the other end communicates with the outside of the heat dissipation structure 2, 3 to keep an ambient state to adjust the pressure of the internal gas. When the first heat dissipation material 22a is heated and expands, the excess gas of the electronic package 2b can quickly escape to a predetermined region. For example, one of the ends of the gas section 202 (e.g., an open end) is connected to the fluid section 201, and the other end of the gas section 202 (e.g., an open end) is positioned far away from the fluid section 201, as shown in FIG. 3C, which communicates with the peripheral area C, or as shown in FIG. 3G-1 and FIG. 3H-1, which communicates with the ambient.

The fluid section 201 is arranged in a ring shape, as shown in FIGS. 3B, 3G-3 and 3H-3, and its cross-sectional area D is tapered toward the gas section 202, as shown in FIG. 3A.

Figures 1, 3G:
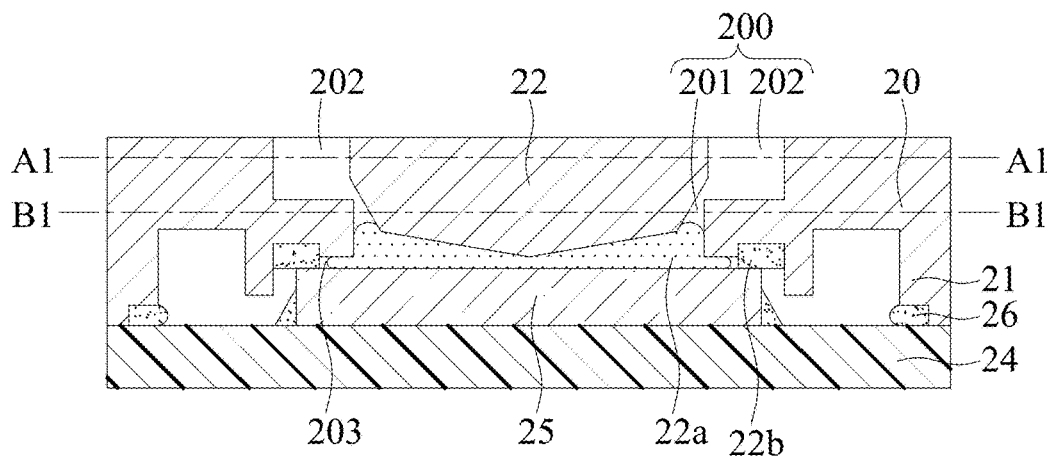
Figures 2, 3G:
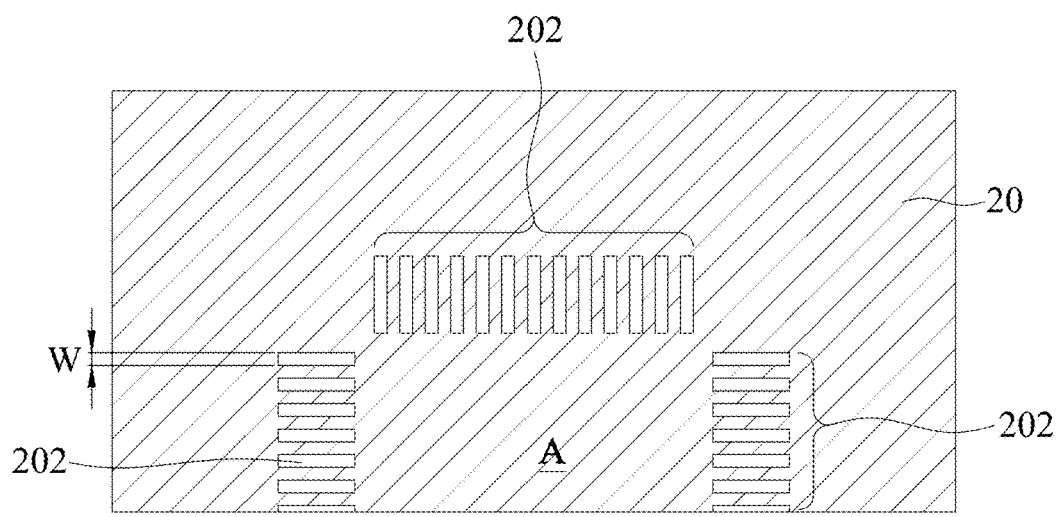
Figures 3, 3G:
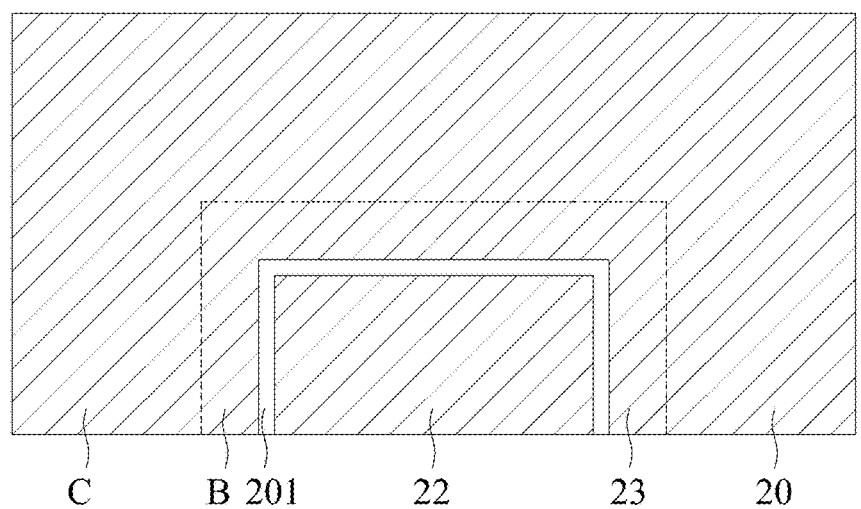
Figures 1, 3H:
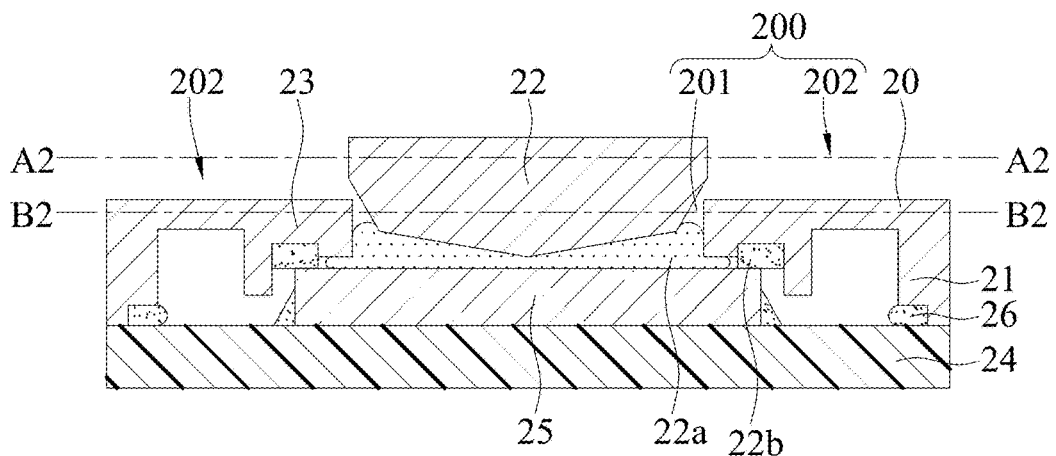
Figures 2, 3H:
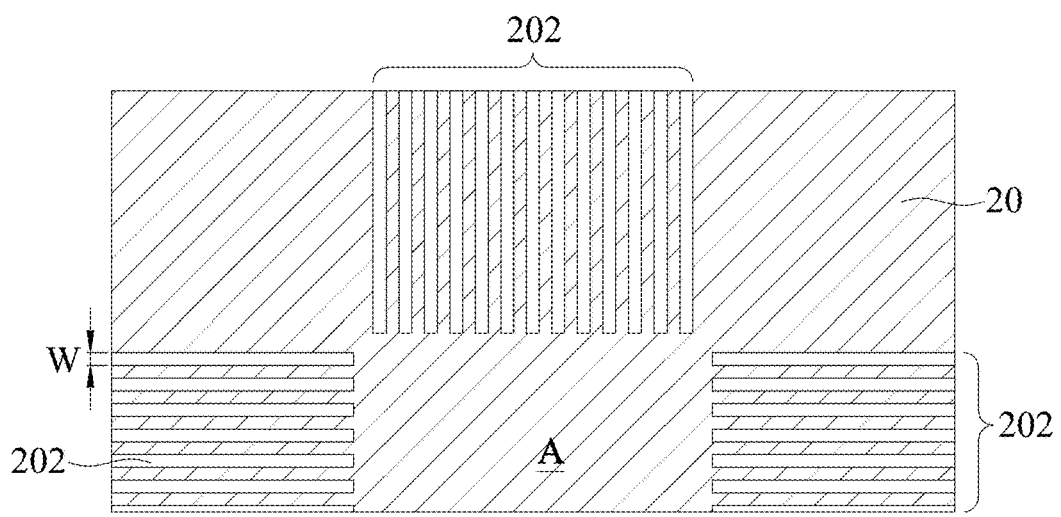
Figures 3, 3H:
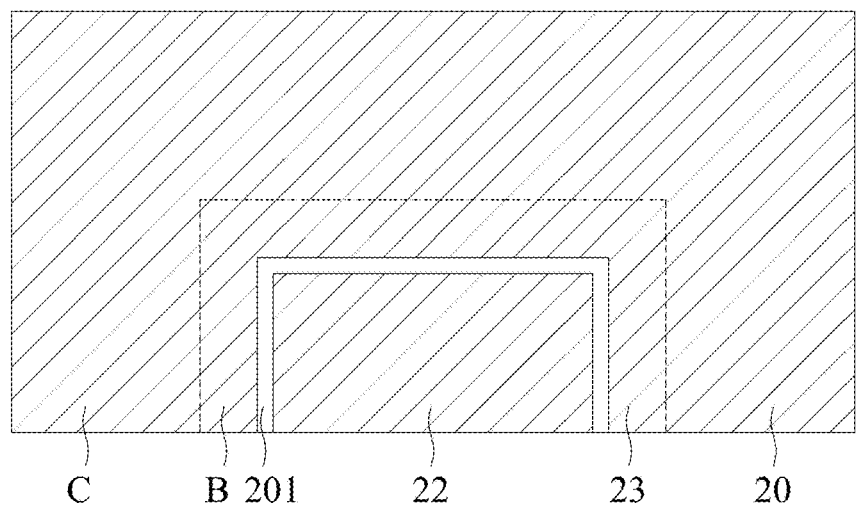

The gas section 202 is a channel, as shown in FIG. 3B, FIG. 3G-2 and FIG. 3H-2, and its cross-sectional area (such as a distance W between opposite sides) can be gradually reduced according to requirements (such as an upper surface of the ring body 23 as shown in FIG. 3B) or uniform (as shown in FIG. 3G-2 and FIG. 3H-2), and if its cross-sectional area is tapered, the gas discharge flow rate can be gradually increased to facilitate the gas to quickly escape to the outside. For example, a channel path and shape of the gas section 202 can be designed according to requirements, such as a tapered funnel shape as shown in FIG. 3B, a short straight strip shape as shown in FIG. 3G-2, and a long straight strip shape shown in FIG. 3H-2 or other suitable designs, and there are no specific limitations. It should be understood that the adjustment channel 200 may have a plurality of gas sections 202, as shown in FIG. 3G-2 or FIG. 3H-2, and each of the gas sections 202 is connected to the fluid section 201.

Furthermore, the active area B can also be formed with at least one buffer channel 203 communicating with the fluid section 201, as shown in FIGS. 3A and 3C, such that the buffer channel 203 and the gas section 202 are arranged separately on opposite sides of the ring body 23, such that the first heat dissipation material 22a can be filled into the buffer channel 203 after being pressed, so as to disperse a pressing force of the first heat dissipation material 22a during the manufacturing process. For example, one port of the buffer channel 203 communicates with the fluid section 201, and the second heat dissipation material 22b seals the other port of the buffer channel 203 to prevent the diffusion of the first heat dissipation material 22a and flow out from the other port of the buffer channel 203. Therefore, the second heat dissipation material 22b can prevent the first heat dissipation material 22a from leaking from the side (that is, the direction of a side surface 25c of the electronic component 25).

Therefore, in the electronic package 2b, when the second heat dissipation material 22b closes the buffer channel 203, a high pressure will be formed in the buffer channel 203 (a high pressure formed by a gas that cannot escape after being squeezed), thereby causing the first heat dissipation material 22a to flow toward the fluid section 201.

In addition, the second heat dissipation material 22b has a low thermal conductivity, about 2-20 Wm$^{-1}$K$^{-1}$, which can be a combination film containing silicone material or ultraviolet (UV) glue such as acrylic material, and can also contain metal particles, graphite material or other suitable fillers. For example, the silicone material not only has high ductility, but also has a higher thermal conductivity than UV glue. Therefore, compared to UV glue, the second heat dissipation material 22b is preferably a silicone material.

The supporting leg 21 is positioned in the edges of the peripheral area C, such that the supporting leg 21 is away from the active area B.

In the first and second embodiments, the peripheral area C can be formed with a frame 23a corresponding to the ring body 23 depends on requirements, such that at least one auxiliary channel 204 extending from the gas section 202 is formed between the ring body 23 and the frame body 23a, as shown in FIG. 3A. And, the gas section 202 and the auxiliary channel 204 form a curved channel. For example, the supporting leg 21 may be adjacent to the frame body 23a to form a relatively regular-shaped air space Z in the peripheral area C, as shown in FIG. 3C.

The supporting leg 21 is erected on the carrying structure 24 by a bonding material 26 such as glue.

In the first and second embodiments, the supporting leg 21 can be formed with at least one accommodating opening 210 that can be filled with a colloid (such as the bonding material 26) as required.

Therefore, in the heat dissipation structures 2, 3 of the present disclosure, the fluid section 201 is defined with a tapered cross-sectional area D, such that a width D1 of an entrance side of the first heat dissipation material 22a is larger (the pressure here is less), as shown in FIG. 3D, and at the same time, because a width D3 of a cross-sectional area of a port of the buffer channel 203 (between 20 microns to 300 microns, such as 50 microns at the entrance) is relatively smaller than the larger width D1 of the fluid section 201, the first heat dissipation material 22a will move toward the fluid section 201 with a lower pressure after being under pressure. In addition, when the first heat dissipation material 22a flows under pressure, its lateral flow speed will be faster, so the buffer channel 203 can provide a lateral flow buffer mechanism. Accordingly, an impact force of the first heat dissipation material 22a flowing toward the fluid section 201 will not be too large to escape into the gas section 202.

Furthermore, a width D2 of an opening side of the fluid section 201 communicating with the gas section 202 is relatively small, and is designed with a tapered cross-sectional area, as shown in FIG. 3D, which enables the volume (or the amount of liquid metal) initially filled into the fluid section 201 of the first heat dissipation material 22a to be prevented from being too much. Therefore, most of the first heat dissipation material 22a is still combined on the inactive surface 25b of the electronic component 25, and the amount of the first heat dissipation material 22a (or liquid metal) is reduced to reduce the material cost.

In addition, because the size of the gas section 202 is designed as a microchannel (a height H of the cross-sectional area shown in FIG. 3D is 10 microns to 1200 microns, preferably 10 microns to 800 microns, such as 500 microns), surface tension and cohesion can be used to produce the effect of stopping the overflow of the first heat dissipation material 22a to this point.

Based on the manufacturing method, as shown in FIG. 2, the heat dissipation structure 3 of the first embodiment divides the heat dissipation structure 2 of the second embodiment shown in FIG. 3A into two plates, such that the two plates respectively serve as the first heat dissipation element 3a and the second heat dissipation element 3b, such that when the first heat dissipation element 3a is combined with the second heat dissipation element 3b by a bonding material 36 such as glue, the heat dissipation structure 3 is formed with the adjustment channel 200, the buffer channel 203, and the auxiliary channel 204.

Figures 1, 4A:
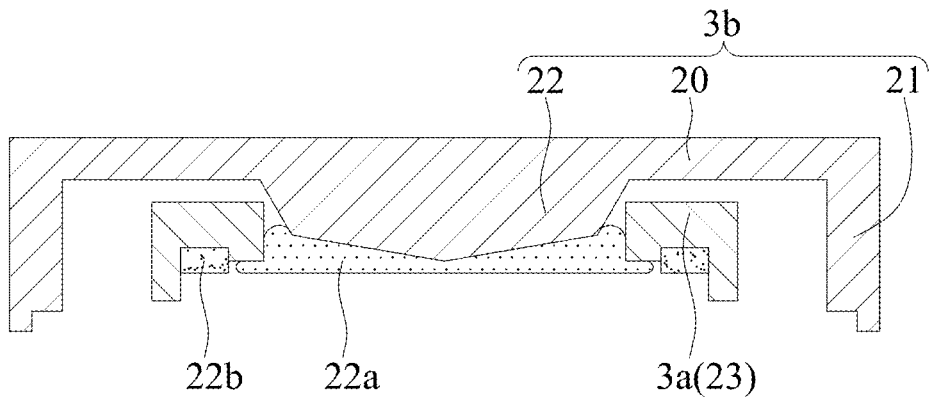
Figures 2, 4A:
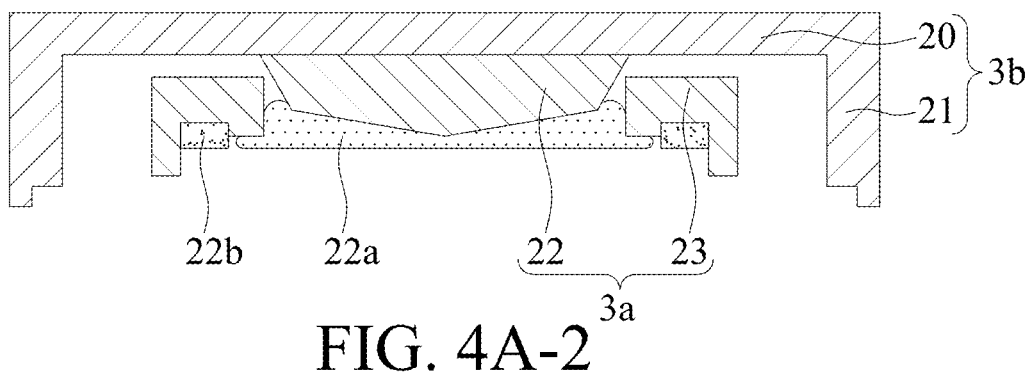
Figures 3, 4A:
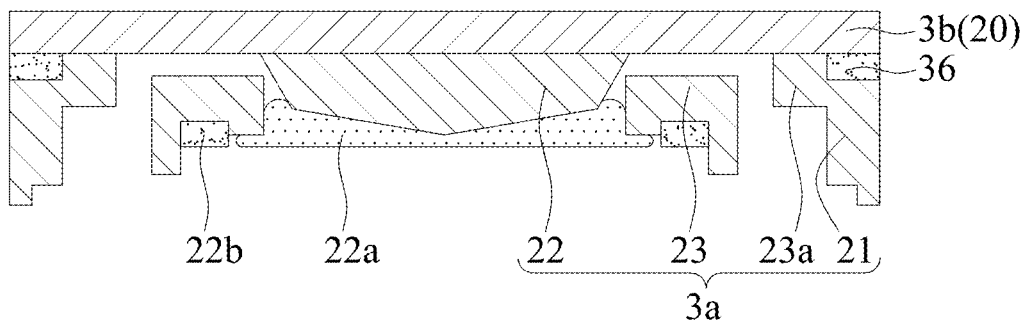
Figures 1, 4B:
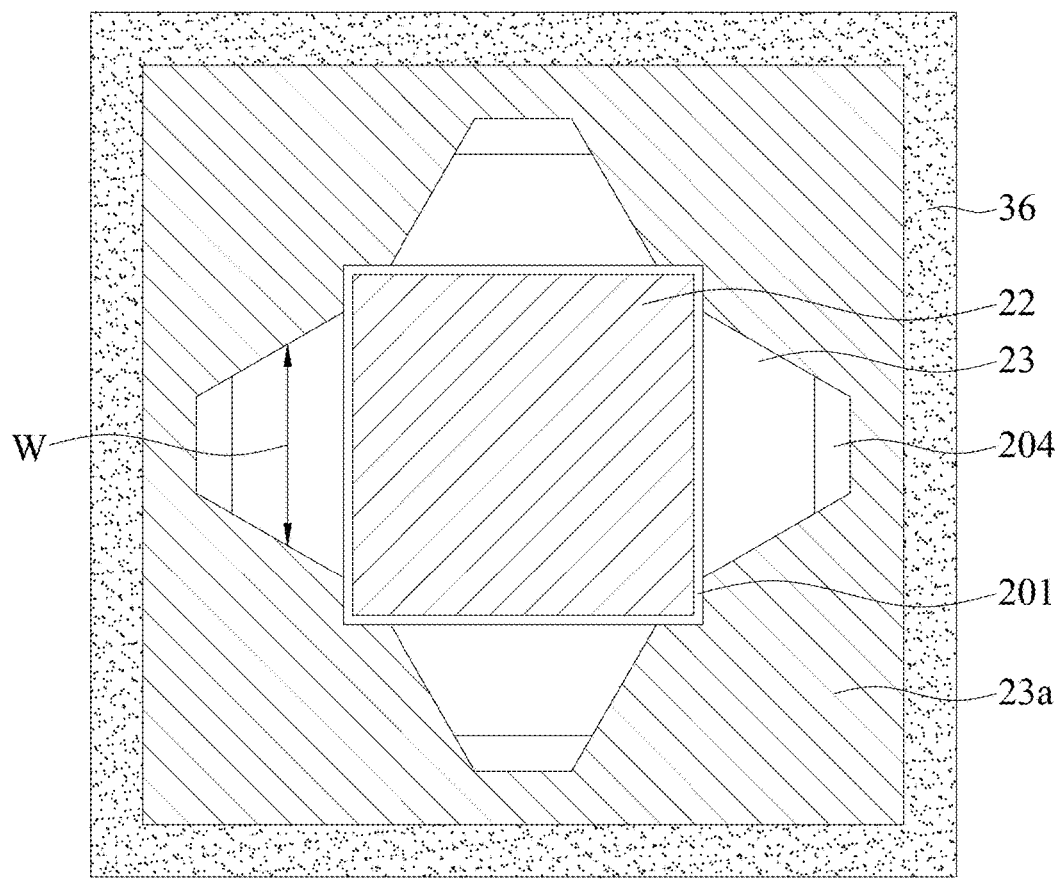

In the first embodiment, the first heat dissipation element 3a includes the supporting leg 21, the ring body 23, and the frame 23a, and the second heat dissipation element 3b includes the heat dissipation body 20 and the heat dissipation block 22, wherein the bonding material 36 is formed between the heat dissipation body 20 and the supporting leg 21, as shown in a ring distribution as shown in FIG. 4B-1.

In other embodiments, the configurations of the first heat dissipation element 3a and the second heat dissipation element 3b can be designed according to requirements. For example, in FIG. 4A-1, the first heat dissipation element 3a includes the ring body 23, and the second heat dissipation element 3b includes the heat dissipation body 20, the supporting leg 21 and the heat dissipation block 22, and the frame 23a and the bonding material 36 are omitted. Alternatively, in FIG. 4A-2, the first heat dissipation element 3a includes the heat dissipation block 22 and the ring body 23, and the second heat dissipation element 3b includes the heat dissipation body 20 and the supporting leg 21, and the frame 23a and the bonding material 36 are omitted. Or, in FIG. 4A-3, the first heat dissipation element 3a includes the support leg 21, the heat dissipation block 22, the ring body 23, and the frame 23a, and the second heat dissipation element 3b includes the heat dissipation body 20. It should be understood that the shape of the first heat dissipation element 3a and the second heat dissipation element 3b can be designed according to requirements, and there is no particular limitation.

Figures 2, 3, 4, 4B:
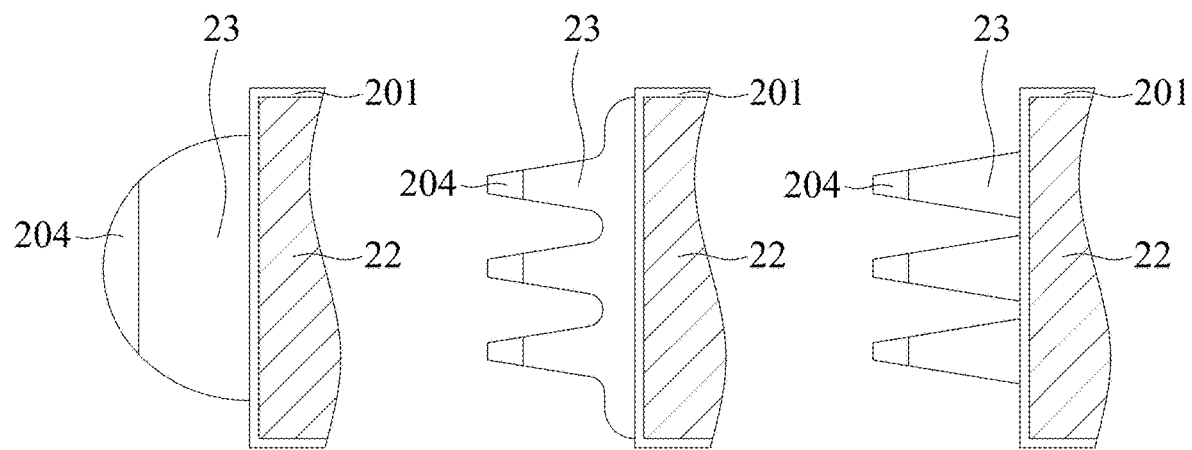
Figures 4, 4B, 5:
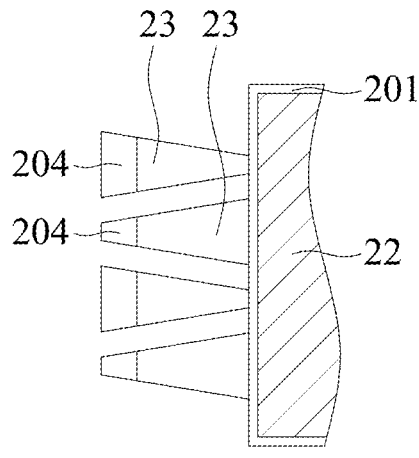
Figures 4, 4B, 5, 6:
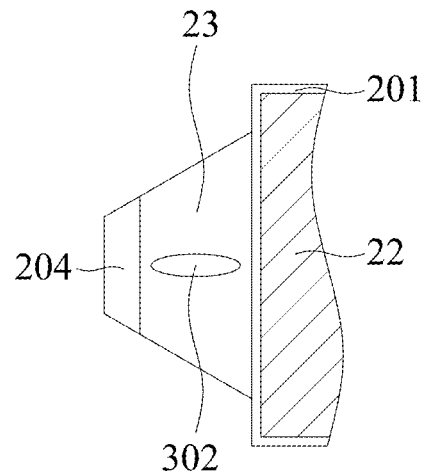
Figures 4, 4B, 5, 6, 7:
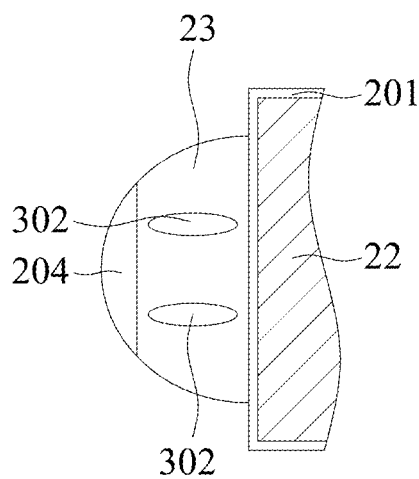
Figures 4, 4B, 5, 6, 7, 8:
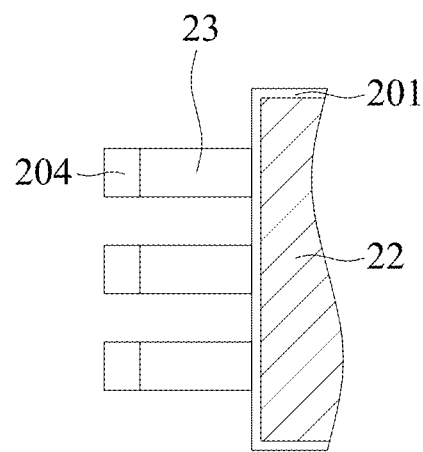

In the first and second embodiments, the channel path and shape of the gas section 202 located above the ring body 23 can also be designed depending on requirements, such as an upper surface of an arc-shaped ring body 23 shown in FIG. 4B-2, an upper surface of a tapered fin-shaped ring body 23 shown in FIG. 4B-3, an upper surface of multiple small tapered funnel-shaped ring body 23 shown in FIG. 4B-4, an upper surface of multiple complementary trapezoidal ring bodies 23 arranged in staggered form shown in FIG. 4B-5, and it is even possible to form at least one bump 302 on the channel as a shunt design (as shown in FIG. 4B-6 or FIG. 4B-7). It should be understood that the channel path and shape of the gas section 202 are not limited to a tapered shape, and can also be straight, such as an upper surface of multiple rectangular ring bodies 23 shown in FIG. 4B-8.

Figures 1, 4C:
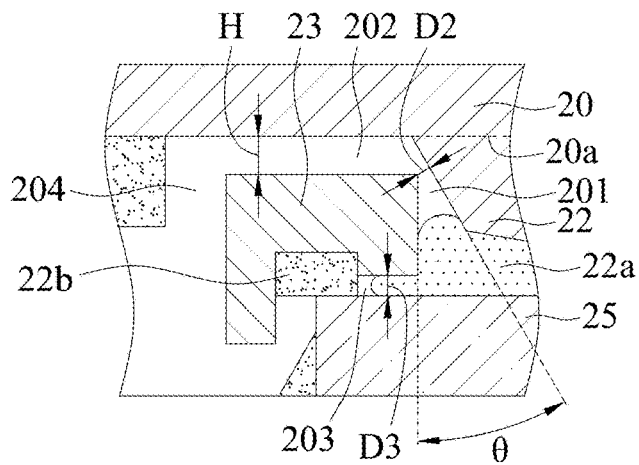
Figures 2, 4C:
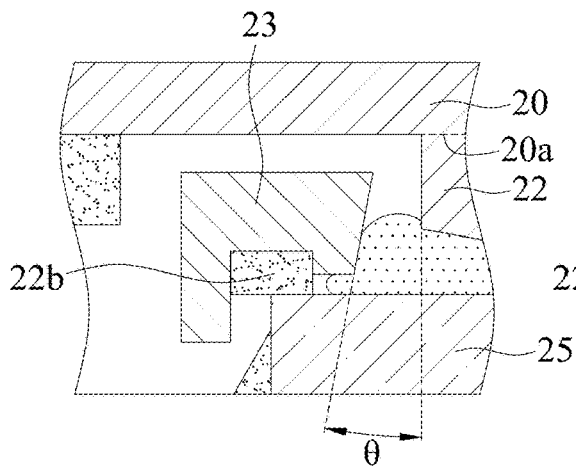
Figures 3, 4C:
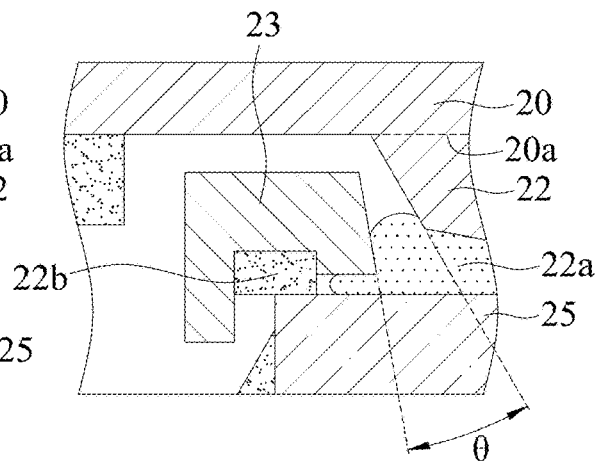
Figures 4, 4C:
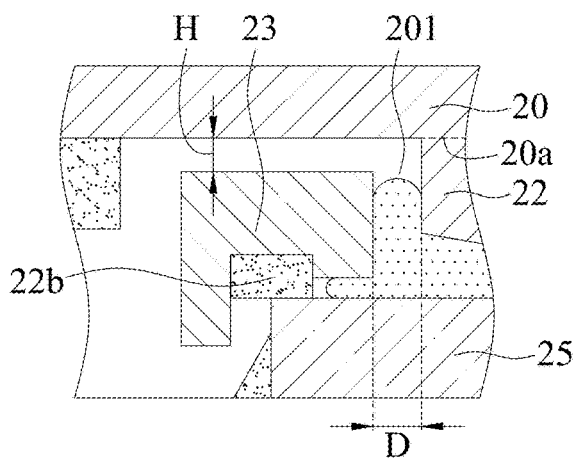

Furthermore, a cross-sectional area D of the fluid section 201 can be changed according to a relative surface between the ring body 23 and the heat dissipation block 22, such that the cross-sectional area D of the fluid section 201 can be tapered with an included angle θ formed by its opposite sides, and the included angle θ is at most 70 degrees (as shown in FIG. 4C-1). For example, a side surface of the ring body 23 is perpendicular to a surface of the first side 20a of the heat dissipation body 20, and the side surface of the heat dissipation block 22 is inclined relative to the surface of the first side 20a of the heat sink 20 to form a tapered channel as shown in FIG. 4C-1. Alternatively, the side surface of the ring body 23 is inclined relative to the surface of the first side 20a of the heat dissipation body 20, and the side surface of the heat dissipation block 22 is perpendicular to the surface of the first side 20a of the heat dissipation body 20 to form a tapered channel as shown in FIG. 4C-2. Alternatively, both the side surface of the ring body 23 and the side surface of the heat dissipation block 22 are inclined relative to the surface of the first side 20a of the heat dissipation body 20 (such as a tapered channel shown in FIG. 4C-3). It should be understood that the cross-sectional area D of the fluid section 201 can also be uniform, for example, both the side surface of the ring body 23 and the side surface of the heat dissipation block 22 are perpendicular to the surface of the first side 20a of the heat dissipation body 20 (such as a flattened channel shown in FIG. 4C-4).

Furthermore, the height H of the cross-sectional area of the gas section 202 can also be tapered based on an included angle formed by its opposite sides, and the included angle is at most 70 degrees, and is not limited to the same width state as shown in FIG. 4C-1. For example, in order to prevent the first heat dissipation material 22a from overflowing into the gas section 202, the height H of the gas section 202 is set to be 10 microns to 1200 microns, preferably 10 microns to 800 microns, and the minimum width D2 of the fluid section 201 (that is, where the fluid section 201 is connected to the end of the gas section 202) needs to be smaller than the minimum height H of the gas section 202.

It should be understood that the width D3 of the buffer channel 203 (the flattened channel shown in FIG. 4C-1 or the tapered channel shown in FIG. 4D) or the width of the auxiliary channel 204 (the uniform type shown in FIG. 4C-1) can also be changed according to needs. Preferably, the entrance width D3 of the buffer channel 203 is 20 microns to 300 microns.

In addition, a space is defined on the carrying area A, one of the two opposite sides of the space is the surface of the first side 20a, and the other is a horizontal plane separated from the surface of the first side 20a by a gap, and the space is roughly rectangular. In this embodiment, the horizontal plane is the upper surface of the electronic component, such as the carrying area A as shown in FIG. 4E-1, wherein a central point O extends toward the corner of the rectangle to form a long and narrow corner section A1 (such as a sword shape shown in FIG. 4E-1), the center point O extends toward an edge of the rectangle to form an expanded line section A2 (such as a triangle shown in FIG. 4E-1). The height of the wavy curved surface of the concave-convex surface of the heat dissipation block 22 is inconsistent, that is, the wave heights of the adjacent corner section A1 and the line section A2 of the space are different. For example, a wave height h1 of the corner section A1 is relatively high (as shown in FIG. 4E-2, which is closer to the electronic component 25), while a wave height h2 of the line section A2 is relatively low (as shown in FIG. 4E-2, which is further to the electronic component 25).

Therefore, in the heat dissipation structure 2, 3 of the present disclosure, the wave height h1 of the corner section A1 is higher than the wave height h2 of the line section A2, and the volume of the space corresponding to the corner section A1 is smaller than the volume of the space corresponding to the line section A2 to distribute the flow velocity of the first heat dissipation material 22a, that is, the flow velocity of the first heat dissipation material 22a in the corner section A1 is faster than that of the first heat dissipation material 22a in the line section A2, such that the first heat dissipation material 22a arrives at the edge and corner of the carrying area A (or the heat dissipation block 22) in a similar time. Therefore, the heat dissipation block 22 can evenly distribute the first heat dissipation material 22a to improve the heat dissipation uniformity and avoid the problem of thermal stress concentration of the electronic component 25.

Furthermore, the heat dissipation structure 2, 3 of the present disclosure is gradually reduced by the distance W and/or the height H between the opposite sides of the gas section 202 are tapered (that is, the cross-sectional area of the gas section 202 tapers away from the electronic component 25) to further prevent the first heat dissipation material 22a from spilling. For example, under normal circumstances, the height H of the gas section 202 is designed to utilize surface tension and cohesive force to prevent the first heat dissipation material 22a from flowing into the gas section 202. However, if an unexpected situation is encountered, when the first heat dissipation material 22a is squeezed and flows into the gas section 202, the cross-sectional area of the gas section 202 can be tapered to prevent the first heat dissipation material 22a from overflowing to the outside of the gas section 202, thereby causing the problem of spilled pollution.

Figure 4D:
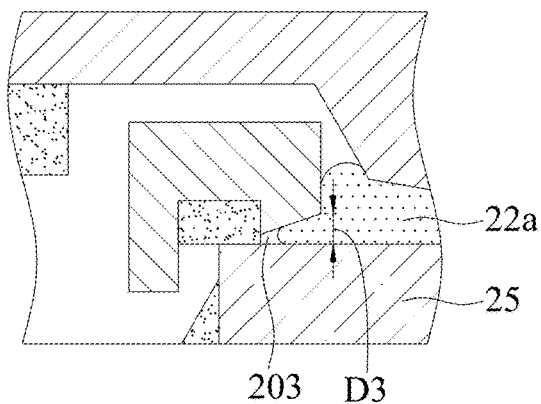
FIG. 4D is a schematic cross-sectional view of another aspect of FIG. 4C-1.
Figures 1, 4E:
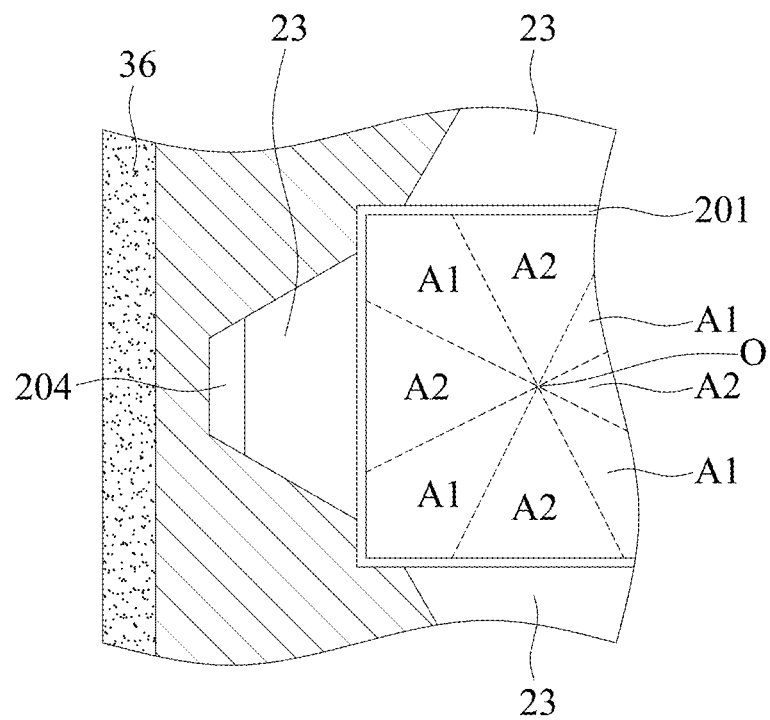
Figures 2, 4E:
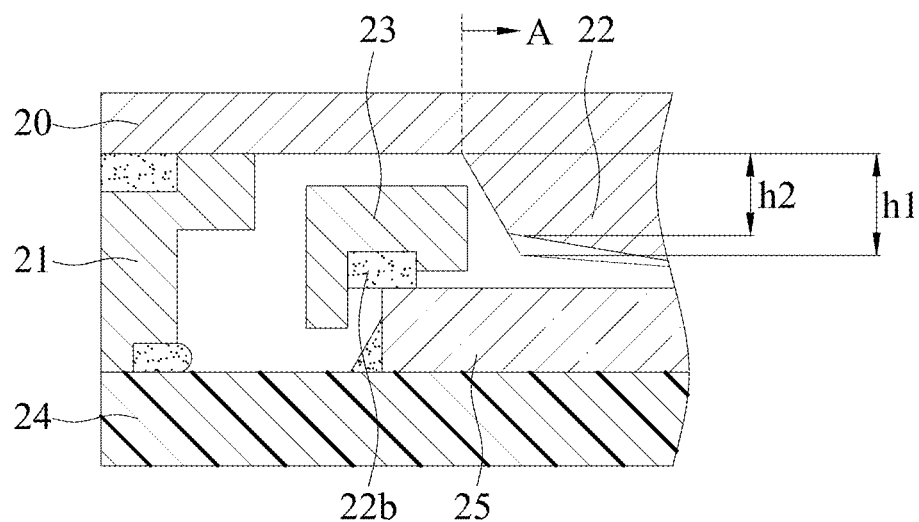

Furthermore, if the buffer channel 203 (as shown in FIG. 4D) is a tapered channel, the effect of buffering a lateral flow pressure of the first heat dissipation material 22a is better.

FIGS. 5A to 5D are schematic cross-sectional views of a manufacturing method for manufacturing an electronic package 4 using the heat dissipation structure 3 of the first embodiment. In this embodiment, the heat dissipation structure plate of FIG. 2 including the first heat dissipation element 3a and the second heat dissipation element 3b is used for description.

Figure 5A:
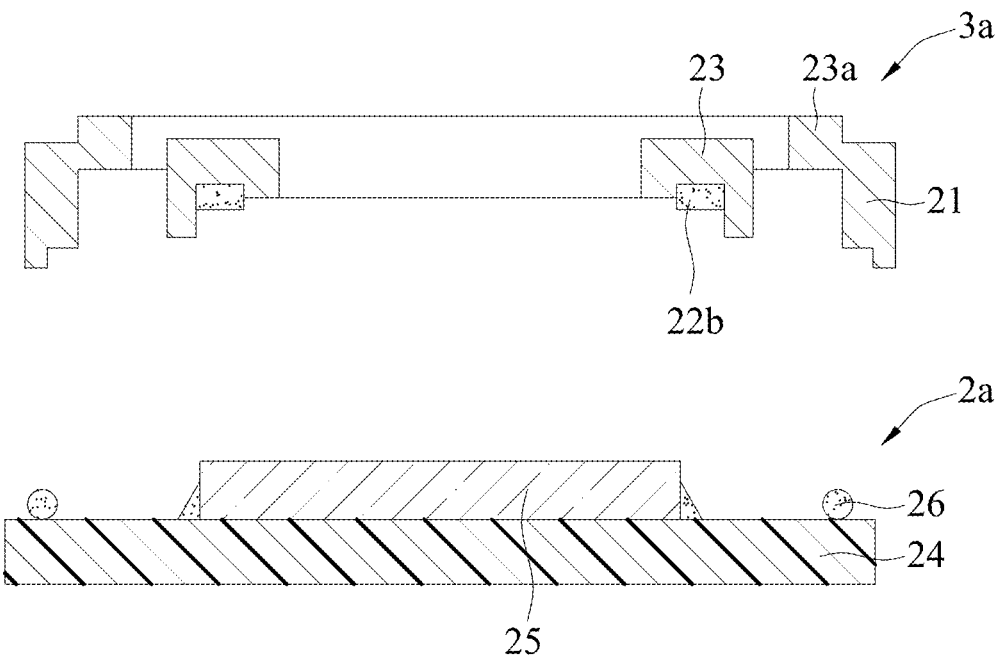
FIGS. 5A to 5D are schematic cross-sectional views of the manufacturing method of the heat dissipation structure of FIG. 2.

As shown in FIG. 5A, first, the heat-generating component 2a and the first heat dissipation element 3a are provided, and the second heat dissipation material 22b is arranged on the ring body 23 of the first heat dissipation material 3a, and the bonding material 26 is formed on the carrying structure 24 of the heat-generating component 2a.

Figure 5B:
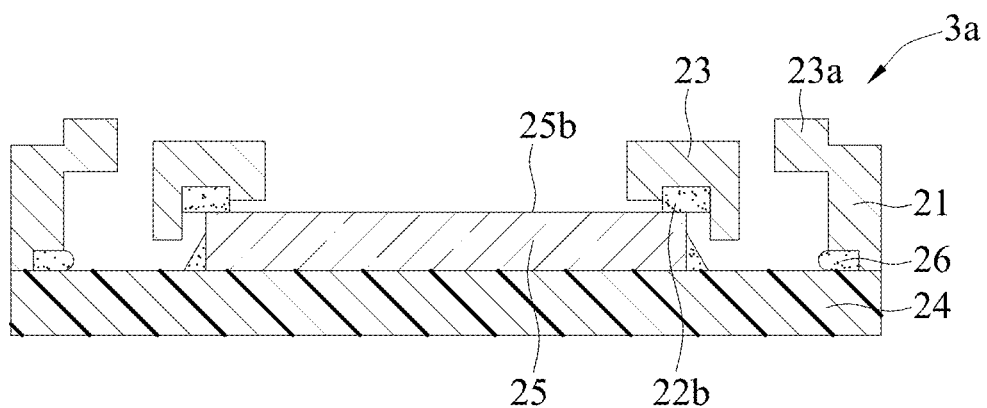

As shown in FIG. 5B, then, the heat-generating component 2a and the first heat dissipation element 3a are combined, such that the ring body 23 of the first heat dissipation element 3a is bonded to the electronic component 25 of the heat-generating component 2a by the second heat dissipation element 22b, and the supporting leg 21 of the first heat dissipation element 3a is bonded to the bonding material 26 on the carrying structure 24 of the heat-generating component 2a, such that the inactive surface 25b of the electronic component 25 is exposed on a ring opening of the ring body 23.

Figure 5C:
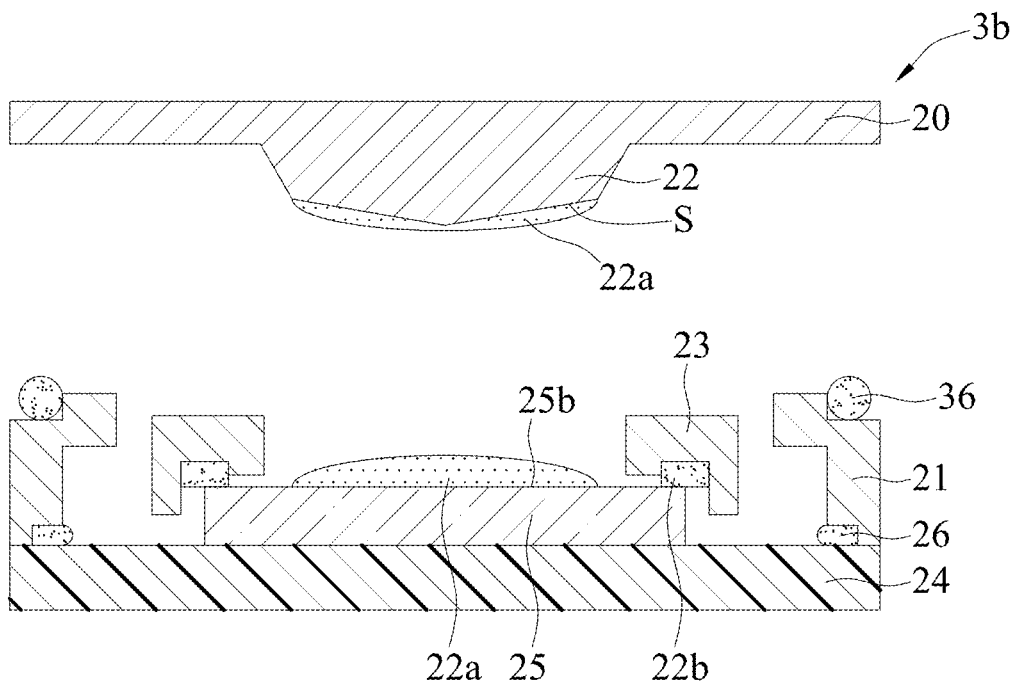

As shown in FIG. 5C, afterwards, the second heat dissipation element 3b is provided, and the first heat dissipation element 22a is arranged on the concave-convex surface S of the heat dissipation block 22, and another bonding material 36 is formed on the supporting leg 21 of the first heat dissipation element 3a, wherein the first heat dissipation material 22a can also be arranged on the inactive surface 25b of the electronic component 25 as required.

Figure 5D:
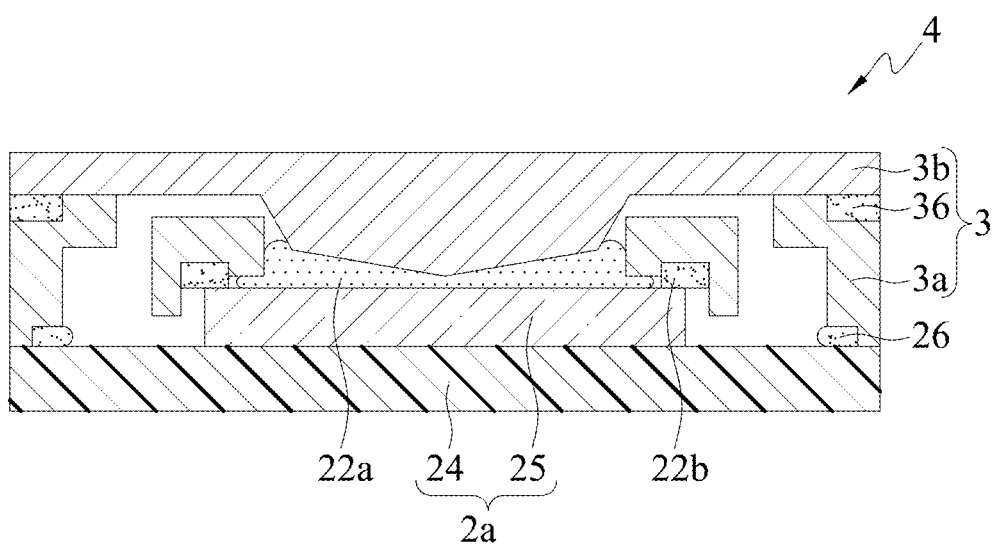

As shown in FIG. 5D, the second heat dissipation element 3b is bonded to the heat-generating component 2a and the first heat dissipation element 3a, such that the heat dissipation block 22 of the second heat dissipation element 3b is pressed onto the inactive surface 25b of the electronic component 25 by the first heat dissipation material 22a, and the heat dissipation body 20 of the second heat dissipation element 3b is bonded to the bonding material 36 on the supporting leg 21.

Therefore, in the foregoing manufacturing method, the second heat dissipation element 3b is pressed against the upper surface of the first heat dissipation element 3a to maintain a center height of the heat dissipation body 20 of the second heat dissipation element 3b and prevent a central part of the second heat dissipation element 3b from directly contacting the inactive surface 25b of the electronic component 25 and damaging the electronic component 25.

Figure 6A:
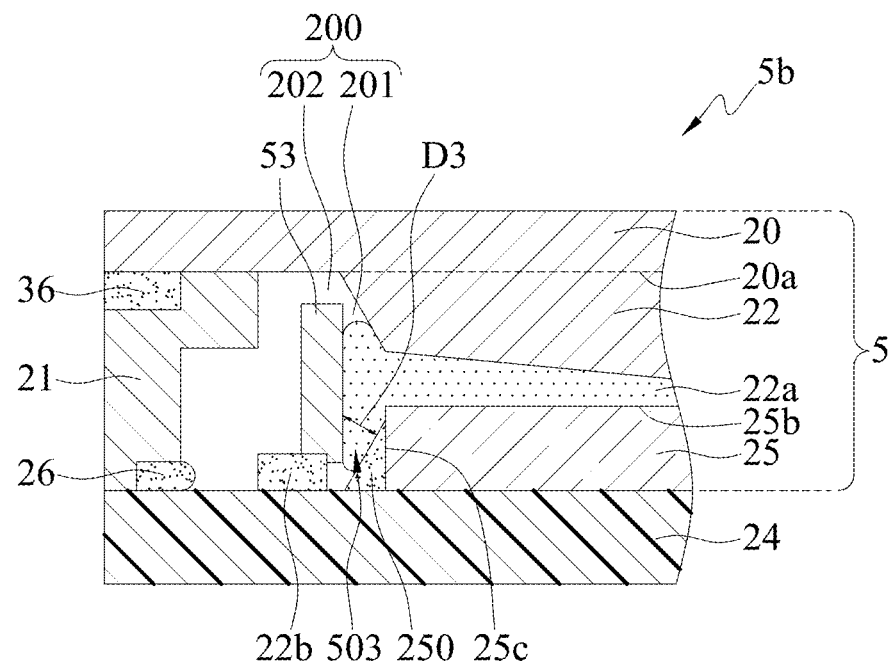
FIG. 6A is a schematic partial cross-sectional view of a third embodiment of the heat dissipation structure used in an electronic package according to the present disclosure.

FIG. 6A is a schematic cross-sectional view of a third embodiment of a heat dissipation structure 5 of the present disclosure. The difference between this embodiment and the first embodiment lies in a configuration of the ring body 53, so the same points will not be repeated in the following.

As shown in FIG. 6A, the ring body 53 is bonded to the carrying structure 24 of the heating object 2a by the second heat dissipation material 22b and is not arranged on the inactive surface 25b of the electronic component 25, such that a buffer channel 503 and the fluid section 201 are channels extending in the same direction (for example, from the surface of the carrying structure 24 to the direction of the first side 20a of the heat dissipation body 20).

In this embodiment, the buffer channel 503 is located between the ring body 53 and the side surface 25c of the electronic component 25, and the first heat dissipation material 22a will flow to the side surface 25c of the electronic component 25 or the underfill 250 under pressure. However, the buffer channel 503 is sealed by the second heat dissipation material 22b to prevent the first heat dissipation material 22a from flowing out of the ring body 53 from the buffer channel 503.

Figure 6B:
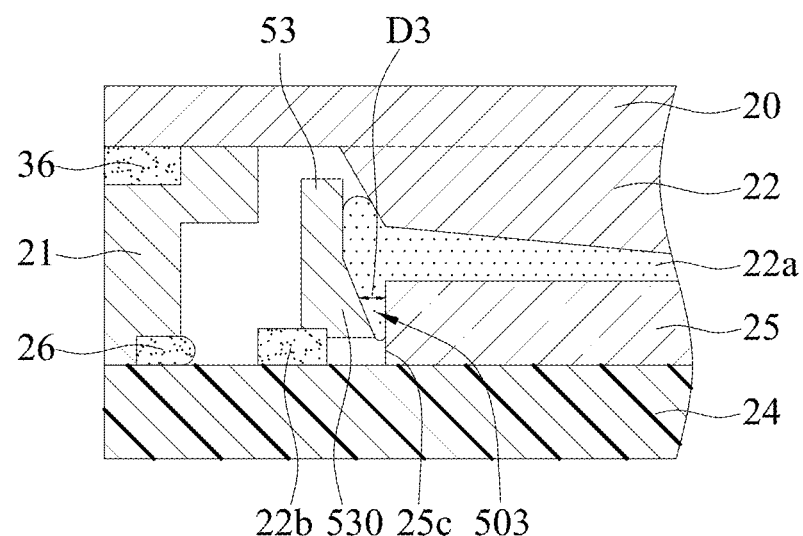
FIG. 6B is a schematic cross-sectional view of another aspect of FIG. 6A.

Furthermore, the width D3 of the buffer channel 503 can be changed according to requirements. For example, the width D3 of the buffer channel 503 is gradually reduced from top to bottom by the underfill 250 surrounding the side surface 25c of the electronic component 25 in a wedge shape, as shown in FIG. 6A. For instance, a cross-sectional area of the buffer channel 503 is tapered along the side surface 25c of the electronic component 25 toward the carrying structure 24. Alternatively, as shown in FIG. 6B, a ring body 53 is formed with a wedge 530 toward the side surface 25c of the electronic component 25, such as a slope, on an end side bonding to the second heat dissipation material 22b, so as to reduce the width D3 of the buffer channel 503. For instance, an inner side surface of the ring body 53 corresponding to the electronic component 25 is formed with the wedge 530 whose thickness gradually increases toward the carrying structure 24.

Therefore, in the heat dissipation structure 5 of the present disclosure, the buffer channel 503 and the fluid section 201 can form up and down bidirectionally adjustable fluid channels, so as to adjust the thermal expansion volume of the first heat dissipation material 22a in the up and down direction, and achieve the purpose of three-dimensional heat dissipation.

Furthermore, since the first heat dissipation material 22a of this embodiment contacts the side surface 25c of the electronic component 25 to help dissipate heat, the three-dimensional heat dissipation effect of this embodiment is better than the three-dimensional heat dissipation effect of the first and second embodiments.

Figure 7A:
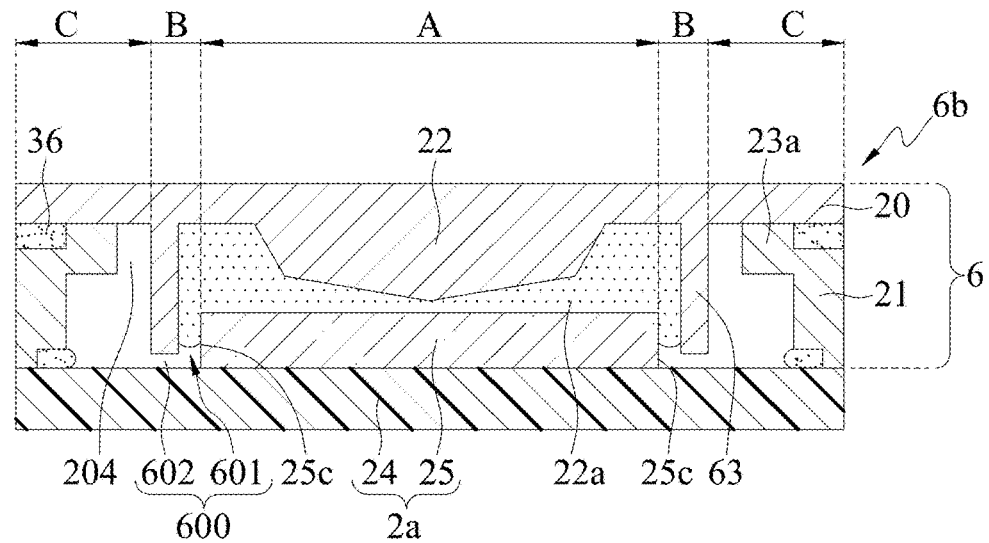
FIG. 7A is a schematic cross-sectional view of a fourth embodiment of the heat dissipation structure used in the electronic package according to the present disclosure.

FIG. 7A is a schematic cross-sectional view of a fourth embodiment of a heat dissipation structure 6 of the present disclosure. The difference between this embodiment and the above-mentioned embodiments lies in the design of the carrying area A and the active area B, so the same points will not be repeated in the following.

In the electronic package 6b shown in FIG. 7A, the ring body 63 serves as an inner leg, which is arranged in the same direction as the supporting leg 21, such that no gas section is formed between the ring body 63 and the heat dissipation body 20.

In this embodiment, the fluid section 601 of the adjustment channel 600 is located between the ring body 63 and the side surface 25c of the electronic component 25 for the first heat dissipation material 22a to be arranged along the side surface 25c of the electronic component 21, and the gas section 602 is located between a bottom side of the ring body 63 and the carrying structure 24.

Figure 7B:
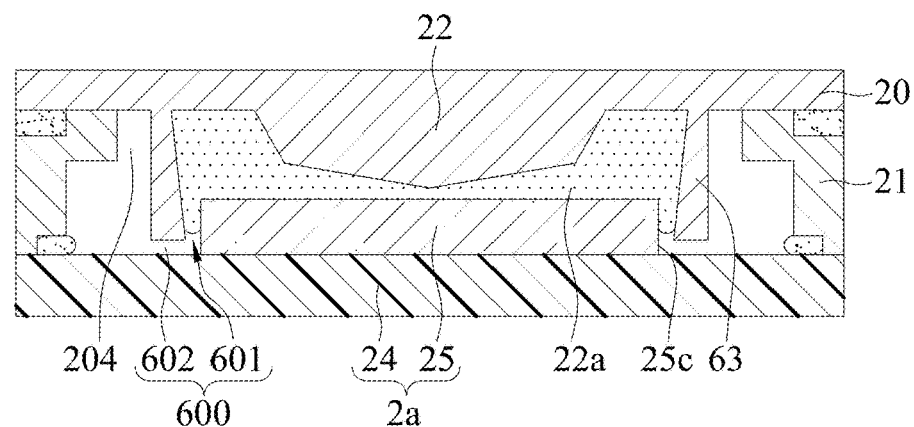
FIGS. 7B and 7C are schematic cross-sectional views of other aspects of FIG. 7A.

Furthermore, the cross-sectional area of the fluid section 601 of the adjustment channel 600 can be changed according to requirements, such as the uniform type as shown in FIG. 7A or the tapered type as shown in FIG. 7B. For example, if the fluid section 601 is tapered, the gas section 602 can be extended between the ring body 63 and the side surface 25c of the electronic component 25 as required, as shown in FIG. 7C.

Figure 7C:
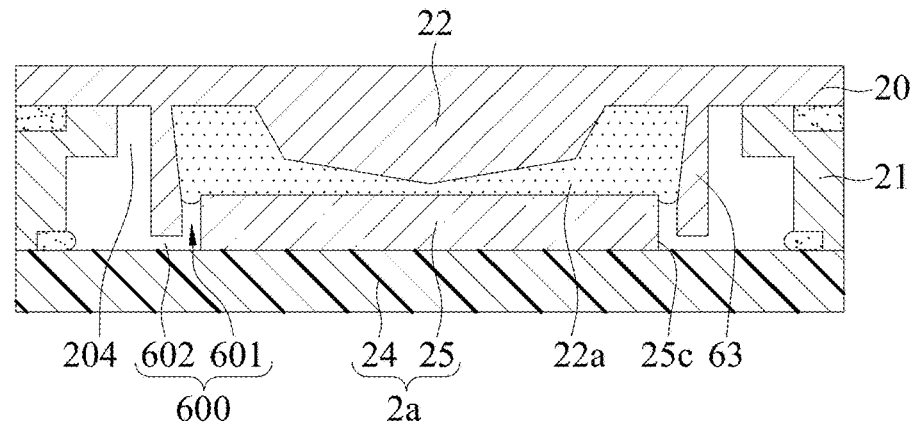

In addition, a length of the fluid section 601 of the adjustment channel 600 can also be changed according to requirements, such as a long channel as shown in FIGS. 7A and 7B or a short channel as shown in FIG. 7C.

In addition, since there is no need to design a buffer channel, there is no need to use the second heat dissipation material 22b.

It should be noted that the fluid section 601 of the adjustment channel 600 extends from the heat dissipation body 20 toward the carrying structure 24, such that a thermal expansion adjustment direction of the first heat dissipation material 22a is adjusted along the side surface 25c of the electronic component 25. Therefore, compared with the first heat dissipating material 22a in the first embodiment, the thermal expansion adjustment direction of the first heat dissipating material 22a is adjusted along the direction away from the electronic component 25. In this embodiment, due to the influence of gravity (the direction of expansion is the direction of gravity, and the direction of shrinkage is the direction of anti-gravity), the first embodiment has the advantages of slower expansion (the direction of expansion is the direction of anti-gravity) and faster shrinkage (the direction of shrinkage is the direction of gravity) of the first heat dissipation material 22a. Therefore, in terms of an overflow prevention effect of the heat dissipation material, the adjustment channel design of the first embodiment is better than the adjustment channel design of the present embodiment.

In summary, the electronic package 2b, 4, 5b, 6b and the heat dissipation structure 2, 3, 5, 6 and manufacturing method of the present disclosure are mainly provided by the fluid section 201, 601 in the adjustment channel 200, 600 to adjust a space where the first heat dissipation material 22a thermally expands, and then an adjustment of the air volume is provided by the gas sections 202, 602, such that the air can be spilled and discharged without being squeezed. Therefore, compared with the prior art, the fluid sections 201, 601 of the present disclosure can provide a space for adjusting the thermal expansion of the first heat dissipation material 22a, such that the first heat dissipation material 22a can be stably laid on the inactive surface 25b of the electronic component 25 at high temperatures. Accordingly, it not only can effectively prevent the first heat dissipation material 22a from overflowing out of the electronic package 2b, 4, 5b, 6b, and thus can avoid the problem of contamination of other components outside the electronic package 2b, 4, 5b, 6b, and can avoid the problem of popcorn by the gas section 202, 602.

Furthermore, the adjustment channel 200, 600 is arranged around the carrying area A, such that the carrying area A can be combined with the heating object 2a (the inactive surface 25b of the electronic component 25) with a larger area (such as a complete heat dissipation block 22), thereby facilitating heat dissipation.

In addition, the cross-sectional area D of the fluid section 201, 601 is tapered toward the direction of the gas section 202, 602, such that the first heat dissipation material 22a can be filled into the fluid section 201, 601. Therefore, compared with the design of the two-dimensional (such as a plane composed of a length and a width) distribution area of the conventional heat dissipation material, the heat dissipation structure 2, 3, 5, 6 of the present disclosure can produce a three-dimensional distribution area (such as a space composed of a length, a width and a height), such that the heat dissipation effect of the heat dissipation structure 2, 3, 5, and 6 of the present disclosure is better.

The foregoing embodiments are used for the purpose of illustrating the principles and effects only rather than limiting the present disclosure. Anyone skilled in the art can modify and alter the above embodiments without departing from the spirit and scope of the present disclosure. Therefore, the range claimed by the present disclosure should be as described by the accompanying claims listed below.

What is claimed is:

1. A heat dissipation structure, comprising:
   a heat dissipation body having a first side and a second side opposite to each other, and a carrying area and an active area adjacent to the carrying area are defined on a surface of the first side, wherein the carrying area is used for applying a first heat dissipation material thereonto;
   an adjustment channel formed in the active area, wherein one end of the adjustment channel communicates with outside of the heat dissipation structure, and the other end of the adjustment channel communicates with the carrying area to adjust a volume of the first heat dissipation material; and
   a buffer channel formed in the active area and in communication with the adjustment channel, wherein the first heat dissipation material is filled into the buffer channel after being pressed.

2. The heat dissipation structure of claim 1, wherein the adjustment channel has a fluid section and a gas section that are connected to each other, the fluid section communicates with the carrying area to adjust the volume of the first heat dissipation material, and one end of the gas section opposite to the fluid section communicates with the outside of the heat dissipation structure.

3. The heat dissipation structure of claim 2, wherein a cross-sectional area of the fluid section is tapered from the carrying area toward the gas section.

4. The heat dissipation structure of claim 3, wherein the fluid section is tapered with an included angle formed by its opposite sides, and the included angle is at most 70 degrees.

5. The heat dissipation structure of claim 3, wherein the smallest width of the cross-sectional area of the fluid section is smaller than a height of a cross-sectional area of the gas section.

6. The heat dissipation structure of claim 2, wherein one of ends of the gas section communicates with the fluid section, and the other end of the gas section is away from the fluid section, such that the cross-sectional area of the gas section is tapered from the fluid section toward the other end.

7. The heat dissipation structure of claim 6, wherein the gas section is tapered with an included angle formed by its opposite sides, and the included angle is at most 70 degrees.

8. The heat dissipation structure of claim 2, wherein the adjustment channel has a plurality of the gas sections, and each of the gas sections communicates with the fluid section.

9. The heat dissipation structure of claim 2, wherein a height of a cross-sectional area of the gas section is 10 microns to 1200 microns.

10. The heat dissipation structure of claim 1, wherein the adjustment channel is formed by stacking a first heat dissipation element and a second heat dissipation element.

11. The heat dissipation structure of claim 1, wherein a space is defined in the carrying area, one of two opposite sides of the space is the surface of the first side, and the other is a horizontal plane separated from the surface of the first side by a gap, and the space is a rectangle, wherein the carrying area has a corner section extending from a center point toward a corner of the rectangle, and a line section extending from the center point toward an edge of the rectangle, and wherein a volume of the space corresponding to the corner section is smaller than a volume of the space corresponding to the line section.

12. An electronic package, comprising:
a carrying structure;
an electronic component provided on the carrying structure; and
the heat dissipation structure of claim 1 bonded to the electronic component through the first heat dissipation material on the heat dissipation body.

13. The electronic package of claim 12, wherein the adjustment channel has a fluid section and a gas section that are connected to each other, wherein the fluid section communicates with the carrying area to adjust the volume of the first heat dissipation material, and the gas section communicates with the outside of the heat dissipation structure to discharge gas.

14. The electronic package of claim 12, wherein the adjustment channel adjusts the volume of the first heat dissipation material along a direction away from the electronic component.

15. The electronic package of claim 12, wherein a ring body is formed within the active area in a manner that the ring body surrounds a side surface of the electronic component, such that the adjustment channel is located between the ring body and the side surface of the electronic component for adjusting the volume of the first heat dissipation material along the side surface of the electronic component.

16. The electronic package of claim 15, wherein the adjustment channel is further located between a bottom side of the ring body and the carrying structure.

17. The electronic package of claim 12, wherein a ring body is formed on the electronic component by a second heat dissipation material and is positioned within the active area, such that the second heat dissipation material laterally blocks the first heat dissipation material.

18. The electronic package of claim 17, wherein the ring body, the second heat dissipation material, and the electronic component cooperate with each other to form the buffer channel, and one port of the buffer channel communicates with the adjustment channel, and the second heat dissipation material seals the other port of the buffer channel.

19. The electronic package of claim 18, wherein a width of the port of the buffer channel communicates with the adjustment channel is smaller than a width of the port of the adjustment channel communicates with the carrying area.

20. The electronic package of claim 18, wherein a width of a cross-sectional area of the buffer channel is 20 microns to 300 microns.

21. The electronic package of claim 18, wherein a cross-sectional area of the buffer channel is tapered from the carrying area toward the second heat dissipation material.

22. The electronic package of claim 12, wherein the heat dissipation structure further has a ring body surrounding a side surface of the electronic component and bonded to the carrying structure by a second heat dissipation material, such that the ring body, the second heat dissipation material and the side surface of the electronic component cooperate to form the buffer channel, wherein one port of the buffer channel communicates with the adjustment channel, and the second heat dissipation material seals the other port of the buffer channel.

23. The electronic package of claim 22, wherein a cross-sectional area of the buffer channel is tapered along the side surface of the electronic component toward the carrying structure.

24. The electronic package of claim 23, wherein an inner side surface of the ring body corresponding to the electronic component is formed with a wedge whose thickness gradually increases toward the carrying structure.

25. The electronic package of claim 12, wherein the first heat dissipation material includes metal.

26. A manufacturing method of a heat dissipation structure, comprising:
providing a first heat dissipation element and a second heat dissipation element; and
stacking the first heat dissipation element and the second heat dissipation element with each other to form the heat dissipation structure,
wherein the heat dissipation structure comprises:
a heat dissipation body having a first side and a second side opposite to each other, and a carrying area and an active area adjacent to the carrying area are defined on a surface of the first side, wherein the carrying area is used for applying a first heat dissipation material thereonto; and
an adjustment channel formed in the active area, wherein one end of the adjustment channel communicates with outside of the heat dissipation structure, and the other end of the adjustment channel communicates with the carrying area to adjust a volume of the first heat dissipation material.

27. The manufacturing method of a heat dissipation structure of claim 26, wherein the first heat dissipation element includes a ring body, and the second heat dissipation element includes the heat dissipation body, wherein after the first heat dissipation element and the second heat dissipation element are stacked, the ring body and the heat dissipation body are cooperated to form the adjustment channel positioned in the active area.

* * * * *